US012044529B2

United States Patent
Osabe et al.

(10) Patent No.: US 12,044,529 B2
(45) Date of Patent: Jul. 23, 2024

(54) MAGNETIC SENSOR INCLUDING A MAGNETORESISTANCE ELEMENT AND SENSOR SYSTEM

(71) Applicant: Panasonic Intellectual Property Management Co., Ltd., Osaka (JP)

(72) Inventors: Ryo Osabe, Osaka (JP); Hideaki Fujiura, Osaka (JP); Yoshiyuki Saito, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 177 days.

(21) Appl. No.: 17/439,365

(22) PCT Filed: Feb. 19, 2020

(86) PCT No.: PCT/JP2020/006631
§ 371 (c)(1),
(2) Date: Sep. 14, 2021

(87) PCT Pub. No.: WO2020/184115
PCT Pub. Date: Sep. 17, 2020

(65) Prior Publication Data
US 2022/0196378 A1 Jun. 23, 2022

(30) Foreign Application Priority Data
Mar. 14, 2019 (JP) .................. 2019-047567

(51) Int. Cl.
*G01B 7/30* (2006.01)
*G01D 5/16* (2006.01)

(52) U.S. Cl.
CPC ................ *G01B 7/30* (2013.01); *G01D 5/16* (2013.01)

(58) Field of Classification Search
CPC .......... G01B 7/30; G01D 3/028; G01D 3/036; G01D 5/12; G01D 5/14; G01D 5/145;
(Continued)

(56) References Cited

U.S. PATENT DOCUMENTS 4,874,053 A 10/1989 Kimura et al.
6,806,702 B2 * 10/2004 Lamb .................... G01D 5/145
324/207.2
(Continued)

FOREIGN PATENT DOCUMENTS

DE 102015218855 A1 * 3/2017 ............. G01D 5/145
DE 102015218855 A1 3/2017
(Continued)

OTHER PUBLICATIONS

International Search Report issued in corresponding International Patent Application No. PCT/JP2020/006631, dated Apr. 21, 2020, with English translation.
(Continued)

*Primary Examiner* — Huy Q Phan
*Assistant Examiner* — David B Frederiksen
(74) *Attorney, Agent, or Firm* — Rimon P.C.

(57) ABSTRACT

The problem to be overcome by the present disclosure is to reduce harmonic components included in output signals. A magnetic sensor includes a detecting magnetoresistance element and a canceling magnetoresistance element. A tilt angle formed by a magnetic sensing direction of the canceling magnetoresistance element with respect to a magnetic sensing direction of the detecting magnetoresistance element falls within a predetermined range. The predetermined range is defined by reference to either $n\times\alpha/3$ or $n\times\alpha/3+\alpha/2$, where $\alpha$ is an angle of rotation of a rotator corresponding to one cycle of a fundamental harmonic included in output
(Continued)

signals of the detecting magnetoresistance element and n is a natural number equal to or greater than 1.

12 Claims, 10 Drawing Sheets

(58) Field of Classification Search
CPC .... G01D 5/16; G01R 33/0005; G01R 33/028; G01R 33/0283; G01R 33/09; G01R 33/091
See application file for complete search history.

(56) References Cited

U.S. PATENT DOCUMENTS

| | | | |
|---|---|---|---|
| 7,262,594 B1* | 8/2007 | Tomino | G01D 5/145 |
| | | | 73/514.31 |
| 2004/0017187 A1* | 1/2004 | Van Ostrand | G01D 5/145 |
| | | | 324/207.21 |
| 2007/0069719 A1* | 3/2007 | Hatanaka | G01D 5/145 |
| | | | 324/207.25 |
| 2009/0115405 A1 | 5/2009 | Guo et al. | |
| 2009/0206827 A1 | 8/2009 | Aimuta et al. | |
| 2012/0119729 A1 | 5/2012 | Komasaki et al. | |
| 2013/0099783 A1* | 4/2013 | Kubik | G01R 33/0005 |
| | | | 324/252 |
| 2014/0118048 A1* | 5/2014 | Miyazaki | H03K 5/003 |
| | | | 327/307 |
| 2015/0066426 A1 | 3/2015 | Hirota et al. | |
| 2016/0313413 A1* | 10/2016 | Mohan | G01R 33/098 |
| 2018/0292197 A1 | 10/2018 | Furukawa et al. | |
| 2018/0372511 A1* | 12/2018 | Shulver | G01R 33/096 |
| 2019/0316894 A1 | 10/2019 | Hirota et al. | |
| 2020/0041584 A1* | 2/2020 | Lassalle-Balier | G01R 33/091 |
| 2020/0056905 A1* | 2/2020 | Takahashi | F15B 15/28 |

FOREIGN PATENT DOCUMENTS

| | | |
|---|---|---|
| JP | H01-97826 A | 4/1989 |
| JP | 2007-155668 A | 6/2007 |
| JP | 2011-503540 A | 1/2011 |
| JP | 2012-107963 A | 6/2012 |
| JP | 2015-045529 A | 3/2015 |
| JP | 2017-219319 A | 12/2017 |
| WO | 2008/062778 A1 | 5/2008 |
| WO | 2017/090146 A1 | 6/2017 |

OTHER PUBLICATIONS

Japanese Office Action dated Jan. 9, 2024 issued in the related Japanese Patent Application No. 2021-504873, with English machine translation.

* cited by examiner

MAGNETIC SENSOR INCLUDING A MAGNETORESISTANCE ELEMENT AND SENSOR SYSTEM

CROSS-REFERENCE OF RELATED APPLICATIONS

This application is the U.S. National Phase under 35 U.S.C. § 371 of International Patent Application No. PCT/JP2020/006631, filed on Feb. 19, 2020, which in turn claims the benefit of Japanese Application No. 2019-047567, filed on Mar. 14, 2019, the entire disclosures of which Applications are incorporated by reference herein.

TECHNICAL FIELD

The present disclosure generally relates to a magnetic sensor and a sensor system, and more particularly relates to a magnetic sensor including a magnetoresistance element and a sensor system.

BACKGROUND ART

Patent Literature 1 discloses an angle of rotation sensor (sensor system) that uses two magnetic sensors. The angle of rotation sensor of Patent Literature 1 includes the two magnetic sensors and a signal processing IC section (processing circuit). On a printed wiring board, the two magnetic sensors are arranged at respective locations to form an angle θ of 90 degrees between themselves. In addition, magnets fixed to a rotator are arranged on the printed wiring board to face the two magnetic sensors.

In the angle of rotation sensor of Patent Literature 1, a magnetic field, generated by the magnets rotating along with the rotator, is detected by the two magnetic sensors. As a result, a sinusoidal wave is detected as an X-component by one magnetic sensor and a cosine wave is detected as a Y-component by the other magnetic sensor.

CITATION LIST

Patent Literature

Patent Literature 1: JP 2007-155668 A

SUMMARY OF INVENTION

The angle of rotation sensor of Patent Literature 1 may cause erroneous detection due to the presence of harmonic components in output signals of the magnetic sensors. Thus, there is a growing demand for reducing the harmonic components of the output signals.

It is therefore an object of the present disclosure to provide a magnetic sensor and sensor system with the ability to reduce the harmonic components included in the output signals.

A magnetic sensor according to an aspect of the present disclosure is used to detect an angle of rotation of a rotator. The magnetic sensor includes a detecting magnetoresistance element and a canceling magnetoresistance element. A tilt angle formed by a magnetic sensing direction of the canceling magnetoresistance element with respect to a magnetic sensing direction of the detecting magnetoresistance element falls within a predetermined range. The predetermined range is defined by reference to either $n \times \alpha/3$ or $n \times \alpha/3 \alpha/2$, where $\alpha$ is the angle of rotation corresponding to one cycle of a fundamental harmonic included in output signals of the detecting magnetoresistance element and n is a natural number equal to or greater than 1.

A sensor system according to another aspect of the present disclosure includes: the magnetic sensor described above; and a processing circuit. The processing circuit performs signal processing on output signals of the magnetic sensor.

DESCRIPTION OF EMBODIMENTS

Embodiment

(1) Overview

An overview of a magnetic sensor 1 and a sensor system 10 including the magnetic sensor 1 according to an exemplary embodiment will be described with reference to FIGS. 1 and 2.

The magnetic sensor 1 and sensor system 10 according to this embodiment may be used to detect the angle of rotation of a rotator 200 (see FIG. 2) such as a steering shaft for automobiles, for example. Specifically, as the magnetic field generated by a magnet coupled to the rotator 200 via a gear, for example, varies its strength, the resistance values of first detecting magnetoresistors 131-134 and second detecting magnetoresistors 141-144 to be described later also vary. Then, the angle of rotation of the rotator 200 may be detected by detecting the variations in resistance values of the first detecting magnetoresistors 131-134 and the second detecting magnetoresistors 141-144.

Figure 1:
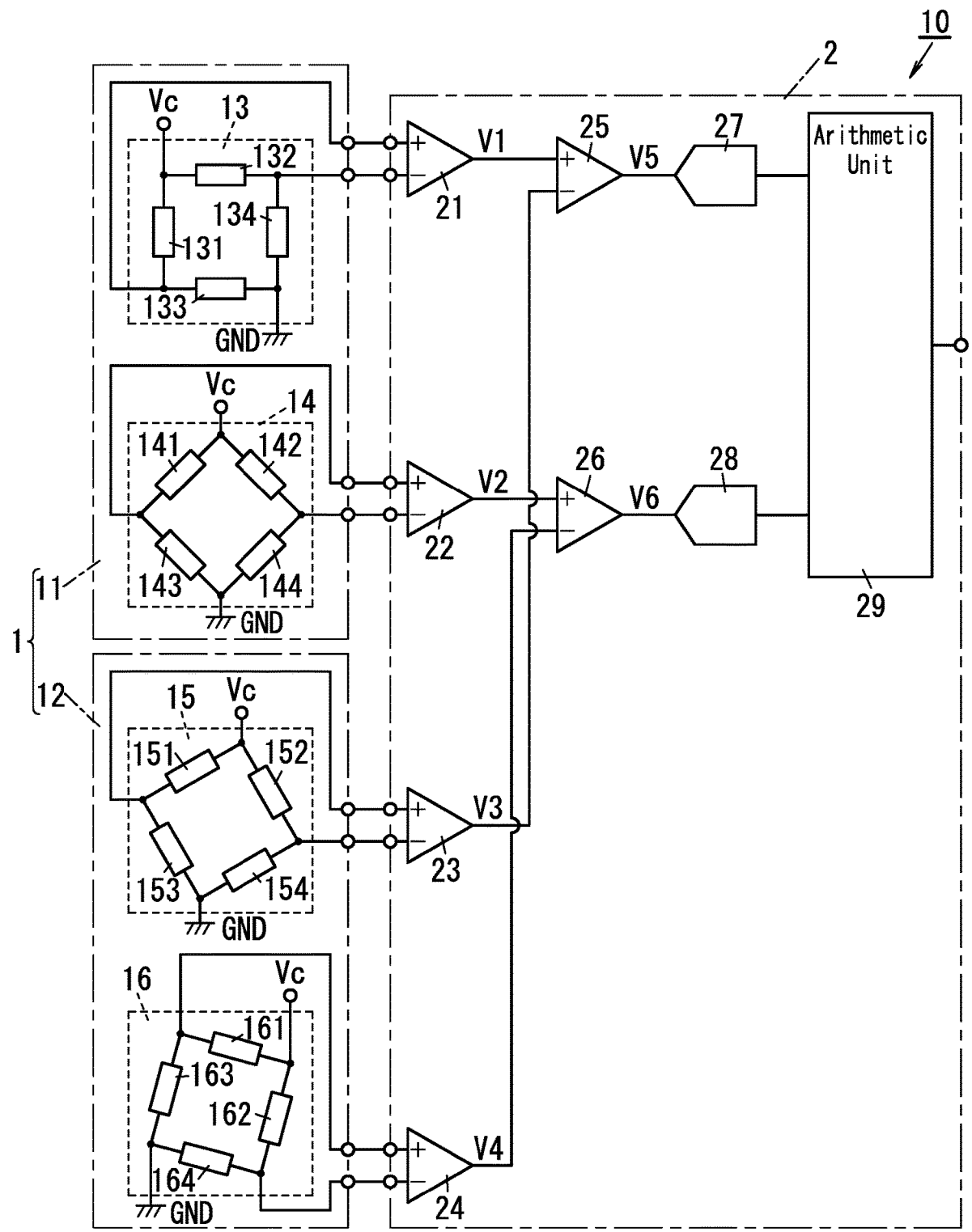
FIG. 1 is a block diagram illustrating a configuration for a magnetic sensor and sensor system according to an exemplary embodiment.

The magnetic sensor 1 according to this embodiment includes a detecting magnetoresistance element 11 and a canceling magnetoresistance element 12 as shown in FIG. 1. In this embodiment, each of the detecting magnetoresistance element 11 and the canceling magnetoresistance element 12 may be implemented as, for example, an anisotropic magnetoresistance (AMR) element.

The detecting magnetoresistance element 11 includes a first detecting bridge circuit 13 and a second detecting bridge circuit 14. The first detecting bridge circuit 13 output a cosine wave signal. The second detecting bridge circuit 14 outputs a sine wave signal. The canceling magnetoresistance element 12 includes a first canceling bridge circuit 15 and a second canceling bridge circuit 16. The first canceling bridge circuit 15 outputs a cosine wave signal. The second canceling bridge circuit 16 outputs a sine wave signal.

The first detecting bridge circuit 13 includes four first detecting magnetoresistance patterns 135-138. The second detecting bridge circuit 14 includes four second detecting magnetoresistance patterns 145-148. The first canceling bridge circuit 15 includes four first canceling magnetoresistance patterns 155-158. The second canceling bridge circuit 16 includes four second canceling magnetoresistance patterns 165-168.

A tilt angle $\beta1$ formed by the magnetic sensing direction M2 of the canceling magnetoresistance element 12 with respect to the magnetic sensing direction M1 of the detecting magnetoresistance element 11 falls within a predetermined range. The predetermined range is defined by reference to either $n \times \alpha/3$ or $n \times \alpha/3 + \alpha/2$, where $\alpha$ is the angle of rotation corresponding to one cycle of a fundamental harmonic W11, W21 (see FIGS. 3A and 4A) included in the output signals V1, V2 of the detecting magnetoresistance element 11 and n is a natural number equal to or greater than 1. In this embodiment, each of the detecting magnetoresistance element 11 and the canceling magnetoresistance element 12 is implemented as an AMR. Thus, the angle of rotation, corresponding to one cycle $\alpha$ of a fundamental harmonic W11, W21, of the rotator 200 is 180 degrees. Also, in this embodiment, a reference of the predetermined range may be 60 degrees, for example. As used herein, the "magnetic sensing direction" refers to a direction in which reaction (sensitivity) to a magnetic flux becomes maximum. For example, if each of the magnetoresistance patterns has a meandering shape as shown in FIG. 2, then the direction in which the meandering shape extends is the magnetic sensing direction.

The sensor system 10 according to this embodiment includes the magnetic sensor 1 described above and a processing circuit 2 as shown in FIG. 1. The processing circuit 2 performs signal processing on the output signals V1, V2, V3, V4 of the magnetic sensor 1.

In the magnetic sensor 1 and sensor system 10 according to this embodiment, the tilt angle $\beta1$ formed by the magnetic sensing direction M2 of the canceling magnetoresistance element 12 with respect to the magnetic sensing direction M1 of the detecting magnetoresistance element 11 falls within the predetermined range. Thus, performing a differential operation between the output signals V1, V2 of the detecting magnetoresistance element 11 and the output signals V3, V4 of the canceling magnetoresistance element 12 may reduce the harmonic components included in the output signals V1, V2. In this case, the output signals V1, V2 include a third harmonic, a fourth harmonic, a fifth harmonic, and so on as the harmonic components. Among other things, the effect caused by the third harmonic is most significant, and therefore, the magnetic sensor 1 and sensor system 10 to be described below remove third harmonic components included in the output signals V1, V2.

(2) Configuration

Next, a configuration for the sensor system 10 according to this embodiment will be described with reference to FIGS. 1 and 2. The sensor system 10 according to this embodiment includes a magnetic sensor 1 and a processing circuit 2 as shown in FIG. 1.

(2.1) Magnetic Sensor

The magnetic sensor 1 includes a detecting magnetoresistance element 11 and a canceling magnetoresistance element 12 as shown in FIG. 1. The detecting magnetoresistance element 11 is an element for detecting the angle of rotation of the rotator 200. The canceling magnetoresistance element 12 is an element for removing harmonic components included in the output signals (first output signals) V1, V2 of the detecting magnetoresistance element 11. In this embodiment, the harmonic components may be third harmonic components included in the output signals V1, V2, for example.

The detecting magnetoresistance element 11 includes a first detecting bridge circuit 13 and a second detecting bridge circuit 14.

The first detecting bridge circuit 13 may be implemented as a full bridge circuit made up of a plurality of (e.g., four in the example illustrated in FIG. 1) first detecting magnetoresistors 131-134, for example. Specifically, a first series circuit is formed by connecting together respective first ends of the first detecting magnetoresistors 131, 133 and a second series circuit is formed by connecting together respective first ends of the first detecting magnetoresistors 132, 134. Then, the first series circuit and the second series circuit are electrically connected in parallel between a reference potential Vc and the ground GND. In other words, the respective second ends of the first detecting magnetoresistors 131, 132 are electrically connected to the reference potential Vc and the respective second ends of the first detecting magnetoresistors 133, 134 are electrically connected to the ground GND. In this case, each of the first detecting magnetoresistors 131-134 has a resistance value, which varies as the magnetic field generated by a magnet coupled to the rotator 200 via a gear, for example, varies. In addition, in this first detecting bridge circuit 13, two cosine wave signals, of which the phases are different from each other by 180 degrees, are respectively output from a node of connection between the first detecting magnetoresistors 131, 133 and a node of connection between the first detecting magnetoresistors 132, 134. Specifically, in this first detecting bridge circuit 13, a +cos signal (cosine wave signal) is output from the node of connection between the first detecting magnetoresistors 131, 133 and a −cos signal (cosine wave signal) is output from the node of connection between the first detecting magnetoresistors 132, 134.

The second detecting bridge circuit 14 may be implemented as a full bridge circuit made up of a plurality of (e.g., four in the example illustrated in FIG. 1) second detecting magnetoresistors 141-144, for example. Specifically, a first series circuit is formed by connecting together respective first ends of the second detecting magnetoresistors 141, 143 and a second series circuit is formed by connecting together respective first ends of the second detecting magnetoresistors 142, 144. Then, the first series circuit and the second series circuit are electrically connected in parallel between the reference potential Vc and the ground GND. In other words, the respective second ends of the second detecting magnetoresistors 141, 142 are electrically connected to the reference potential Vc and the respective second ends of the second detecting magnetoresistors 143, 144 are electrically connected to the ground GND. The second detecting bridge circuit 14 is arranged to define an angle of rotation of 45 degrees with respect to the first detecting bridge circuit 13. Thus, in this second detecting bridge circuit 14, two sine wave signals, of which the phases are different from each other by 180 degrees, are respectively output from a node of connection between the second detecting magnetoresistors 141, 143 and a node of connection between the second detecting magnetoresistors 142, 144. Specifically, in this second detecting bridge circuit 14, a +sin signal (sine wave signal) is output from the node of connection between the second detecting magnetoresistors 141, 143 and a −sin signal (sine wave signal) is output from the node of connection between the second detecting magnetoresistors 142, 144. In other words, the detecting magnetoresistance element 11 includes the first detecting bridge circuit 13 for outputting the cosine wave signals and the second detecting bridge circuit 14 for outputting the sine wave signals.

Meanwhile, the canceling magnetoresistance element 12 includes the first canceling bridge circuit 15 and the second canceling bridge circuit 16.

The first canceling bridge circuit 15 may be implemented as a full bridge circuit made up of a plurality of (e.g., four in the example illustrated in FIG. 1) first canceling magnetoresistors 151-154, for example. Specifically, a first series circuit is formed by connecting together respective first ends of the first canceling magnetoresistors 151, 153 and a second series circuit is formed by connecting together respective first ends of the first canceling magnetoresistors 152, 154. Then, the first series circuit and the second series circuit are electrically connected in parallel between the reference potential Vc and the ground GND. In other words, the respective second ends of the first canceling magnetoresistors 151, 152 are electrically connected to the reference potential Vc and the respective second ends of the first canceling magnetoresistors 153, 154 are electrically connected to the ground GND. The first canceling bridge circuit 15 is arranged to define an angle of rotation of 60 degrees with respect to the first detecting bridge circuit 13. Thus, in this first canceling bridge circuit 15, two cosine wave signals, of which the phases are different from each other by 180 degrees, are respectively output from a node of connection between the first canceling magnetoresistors 151, 153 and a node of connection between the first canceling magnetoresistors 152, 154. Specifically, in this first canceling bridge circuit 15, a +cos signal is output from the node of connection between the first canceling magnetoresistors 151, 153 and a −cos signal is output from the node of connection between the first canceling magnetoresistors 152, 154.

The second canceling bridge circuit 16 may be implemented as a full bridge circuit made up of a plurality of (e.g., four in the example illustrated in FIG. 1) second canceling magnetoresistors 161-164, for example. Specifically, a first series circuit is formed by connecting together respective first ends of the second canceling magnetoresistors 161, 163 and a second series circuit is formed by connecting together respective first ends of the second canceling magnetoresistors 162, 164. Then, the first series circuit and the second series circuit are electrically connected in parallel between the reference potential Vc and the ground GND. In other words, the respective second ends of the second canceling magnetoresistors 161, 162 are electrically connected to the reference potential Vc and the respective second ends of the second canceling magnetoresistors 163, 164 are electrically connected to the ground GND. The second canceling bridge circuit 16 is arranged to define an angle of rotation of 60 degrees with respect to the second detecting bridge circuit 14. In addition, the second canceling bridge circuit 16 is arranged to define an angle of rotation of 45 degrees with respect to the first canceling bridge circuit 15. Thus, in this second canceling bridge circuit 16, two sine wave signals, of which the phases are different from each other by 180 degrees, are respectively output from a node of connection between the second canceling magnetoresistors 161, 163 and a node of connection between the second canceling magnetoresistors 162, 164. Specifically, in this second canceling bridge circuit 16, a +sin signal is output from the node of connection between the second canceling magnetoresistors 161, 163 and a −sin signal is output from the node of connection between the second canceling magnetoresistors 162, 164. In other words, the canceling magnetoresistance element 12 includes the first canceling bridge circuit 15 for outputting the cosine wave signals and the second canceling bridge circuit 16 for outputting the sine wave signals.

Figure 2:
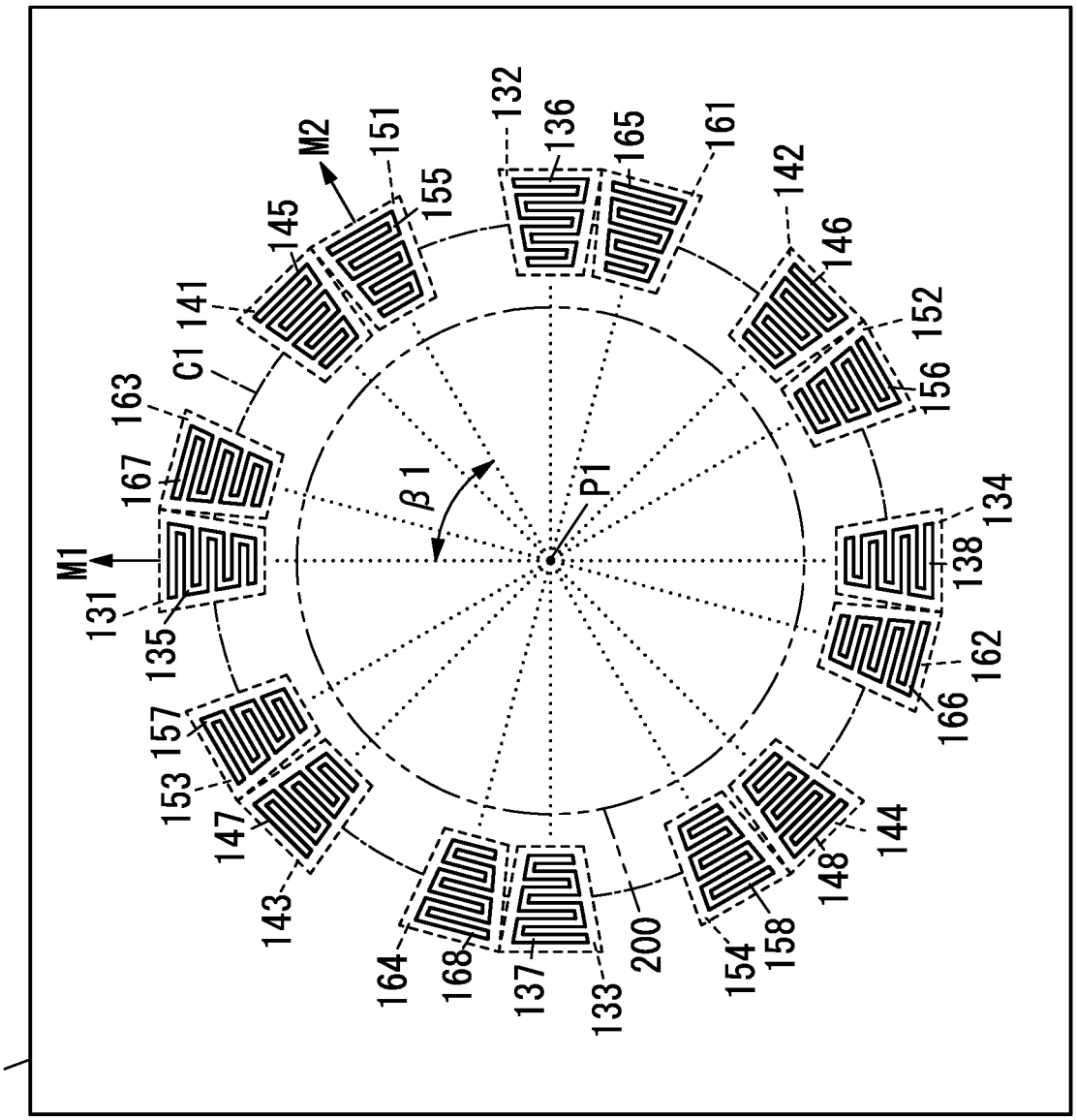
FIG. 2 is a plan view illustrating an exemplary arrangement of magnetoresistance elements that form the magnetic sensor.

FIG. 2 is a plan view illustrating an exemplary arrangement of the detecting magnetoresistance element 11 and the canceling magnetoresistance element 12 that form parts of the magnetic sensor 1 according to this embodiment. The first detecting magnetoresistors 131-134 that form parts the detecting magnetoresistance element 11 respectively have first detecting magnetoresistance patterns 135-138 mounted on one surface of the board 100. The second detecting magnetoresistors 141-144 that form parts of the detecting magnetoresistance element 11 respectively have second detecting magnetoresistance patterns 145-148 mounted on the one surface of the board 100. Meanwhile, the first canceling magnetoresistors 151-154 that form parts of the canceling magnetoresistance element 12 respectively have first detecting magnetoresistance patterns 155-158 mounted on the one surface of the board 100. The second canceling magnetoresistors 161-164 that form parts of the canceling magnetoresistance element 12 respectively have second canceling magnetoresistance patterns 165-168 mounted on the one surface of the board 100.

Each of the first detecting magnetoresistance patterns 135-138 and the second detecting magnetoresistance patterns 145-148 may be configured as a metallic pattern containing an iron-nickel alloy, for example. Each of the first detecting magnetoresistance patterns 135-138 and the second detecting magnetoresistance patterns 145-148 may have, for example, a meandering shape. As used herein, the "meandering shape" refers to a shape which includes a plurality of linear portions arranged in one direction and in which either respective first ends or respective second ends of each pair of adjacent linear portions are connected alternately. The magnetic sensing direction of each of the first detecting magnetoresistance patterns 135-138 and the second detecting magnetoresistance patterns 145-148 is parallel to the direction in which the plurality of linear portions that form the magnetoresistance pattern are arranged side by side.

Each of the first canceling magnetoresistance patterns 155-158 and the second canceling magnetoresistance patterns 165-168 may be configured as a metallic pattern containing an iron-nickel alloy, for example. Each of the first canceling magnetoresistance patterns 155-158 and the second canceling magnetoresistance patterns 165-168 may have, for example, a meandering shape. The magnetic sensing direction of each of the first canceling magnetoresistance patterns 155-158 and the second canceling magnetoresistance patterns 165-168 is parallel to the direction in which the plurality of linear portions that form the magnetoresistance pattern are arranged side by side.

The first detecting magnetoresistance patterns 135-138 and the second detecting magnetoresistance patterns 145-148 are arranged, on the one surface of the board 100, along the circumference C1 of a circle, of which the center is defined by a point P1 that is the center of rotation of the rotator 200 as shown in FIG. 2. On the other hand, the first canceling magnetoresistance patterns 155-158 and the second canceling magnetoresistance patterns 165-168 are arranged, on the one surface of the board 100, along the circumference C1 of the circle, of which the center is defined by the point P1 as shown in FIG. 2. In other words, the first detecting bridge circuit 13, the second detecting bridge circuit 14, the first canceling bridge circuit 15, and the second canceling bridge circuit 16 are arranged along the circumference C1 of the same circle.

The four first detecting magnetoresistance patterns 135-138 that form the first detecting bridge circuit 13 are arranged along the circumference C1. Specifically, each of the first detecting magnetoresistance patterns 136, 137 is arranged such that its magnetic sensing direction forms a tilt angle of 90 degrees with respect to the magnetic sensing direction of the first detecting magnetoresistance pattern 135. Meanwhile, the first detecting magnetoresistance pattern 138 is arranged such that its magnetic sensing direction is aligned with the magnetic sensing direction of the first detecting magnetoresistance pattern 135.

The four second detecting magnetoresistance patterns 145-148 that form the second detecting bridge circuit 14 are arranged along the circumference C1. Specifically, the second detecting magnetoresistance pattern 145 is arranged such that its magnetic sensing direction forms a tilt angle of 45 degrees with respect to the magnetic sensing direction of the first detecting magnetoresistance pattern 135. The second detecting magnetoresistance pattern 146 is arranged such that its magnetic sensing direction forms a tilt angle of 45 degrees with respect to the magnetic sensing direction of the first detecting magnetoresistance pattern 136. The second detecting magnetoresistance pattern 147 is arranged such that its magnetic sensing direction forms a tilt angle of 45 degrees with respect to the magnetic sensing direction of the first detecting magnetoresistance pattern 137. The second detecting magnetoresistance pattern 148 is arranged such that its magnetic sensing direction forms a tilt angle of 45 degrees with respect to the magnetic sensing direction of the first detecting magnetoresistance pattern 138. As a result, the magnetic sensing direction of each of the second detecting magnetoresistance patterns 146, 147 defines a tilt angle of 90 degrees with respect to the magnetic sensing direction of the second detecting magnetoresistance pattern 145. Meanwhile, the magnetic sensing direction of the second detecting magnetoresistance pattern 148 is aligned with the magnetic sensing direction of the second detecting magnetoresistance pattern 145.

The four first canceling magnetoresistance patterns 155-158 that form the first canceling bridge circuit 15 are arranged along the circumference C1. Specifically, the first canceling magnetoresistance pattern 155 is arranged such that its magnetic sensing direction forms a tilt angle of 60 degrees with respect to the magnetic sensing direction of the first detecting magnetoresistance pattern 135. The first canceling magnetoresistance pattern 156 is arranged such that its magnetic sensing direction forms a tilt angle of 60 degrees with respect to the magnetic sensing direction of the first detecting magnetoresistance pattern 136. The first canceling magnetoresistance pattern 157 is arranged such that its magnetic sensing direction forms a tilt angle of 60 degrees with respect to the magnetic sensing direction of the first detecting magnetoresistance pattern 137. The first canceling magnetoresistance pattern 158 is arranged such that its magnetic sensing direction forms a tilt angle of 60 degrees with respect to the magnetic sensing direction of the first detecting magnetoresistance pattern 138. As a result, the magnetic sensing direction of each of the first canceling magnetoresistance patterns 156, 157 defines a tilt angle of 90 degrees with respect to the magnetic sensing direction of the first canceling magnetoresistance pattern 155. Meanwhile, the magnetic sensing direction of the first canceling magnetoresistance pattern 158 is aligned with the magnetic sensing direction of the first canceling magnetoresistance pattern 155.

The four second canceling magnetoresistance patterns 165-168 that form the second canceling bridge circuit 16 are arranged along the circumference C1. Specifically, the second canceling magnetoresistance pattern 165 is arranged such that its magnetic sensing direction forms a tilt angle of 60 degrees with respect to the magnetic sensing direction of the second detecting magnetoresistance pattern 145. The second canceling magnetoresistance pattern 166 is arranged such that its magnetic sensing direction forms a tilt angle of 60 degrees with respect to the magnetic sensing direction of the second detecting magnetoresistance pattern 146. The second canceling magnetoresistance pattern 167 is arranged such that its magnetic sensing direction forms a tilt angle of 60 degrees with respect to the magnetic sensing direction of the second detecting magnetoresistance pattern 147. The second canceling magnetoresistance pattern 168 is arranged such that its magnetic sensing direction forms a tilt angle of 60 degrees with respect to the magnetic sensing direction of the second detecting magnetoresistance pattern 148. As a result, the magnetic sensing direction of each of the second canceling magnetoresistance patterns 166, 167 defines a tilt angle of 90 degrees with respect to the magnetic sensing direction of the second canceling magnetoresistance pattern 165. Meanwhile, the magnetic sensing direction of the second canceling magnetoresistance pattern 168 is aligned with the magnetic sensing direction of the second canceling magnetoresistance pattern 165.

In this embodiment, the magnetic sensing direction of the first detecting bridge circuit 13 made up of the four first detecting magnetoresistance patterns 135-138 is supposed to be, for example, the magnetic sensing direction M1 of the first detecting magnetoresistance pattern 135. Also, the magnetic sensing direction of the second detecting bridge circuit 14 made up of the four second detecting magnetoresistance patterns 145-148 is supposed to be, for example, the magnetic sensing direction of the second detecting magnetoresistance pattern 145. Furthermore, the magnetic sensing direction of the detecting magnetoresistance element 11 made up of the first detecting bridge circuit 13 and the second detecting bridge circuit 14 is supposed to be, for example, the magnetic sensing direction M1 of the first detecting magnetoresistance pattern 135.

On the other hand, the magnetic sensing direction of the first canceling bridge circuit 15 made up of the four first canceling magnetoresistance patterns 155-158 is supposed to be, for example, the magnetic sensing direction M2 of the first canceling magnetoresistance pattern 155. Also, the magnetic sensing direction of the second canceling bridge circuit 16 made up of the four second canceling magnetoresistance patterns 165-168 is supposed to be, for example, the magnetic sensing direction of the second canceling magnetoresistance pattern 165. Furthermore, the magnetic sensing direction of the canceling magnetoresistance element 12 made up of the first canceling bridge circuit 15 and the second canceling bridge circuit 16 is supposed to be, for example, the magnetic sensing direction M2 of the first canceling magnetoresistance pattern 155. Therefore, the tilt angle β1 formed by the magnetic sensing direction M2 of the canceling magnetoresistance element 12 with respect to the magnetic sensing direction M1 of the detecting magnetoresistance element 11 is the tilt angle β1 formed by the magnetic sensing direction M2 of the first canceling magnetoresistance pattern 155 with respect to the magnetic sensing direction M1 of the first detecting magnetoresistance pattern 135 and may be 60 degrees, for example. Note that the tilt angle β1 does not have to be 60 degrees but may fall within a predetermined range including 60 degrees as a reference angle. Specifically, the predetermined range is suitably a range of 60 degrees±10 degrees and more suitably a range of 60 degrees±5 degrees.

(2.2) Processing Circuit

The processing circuit 2 performs signal processing on the output signals of the magnetic sensor 1. As shown in FIG. 1, the processing circuit 2 includes a plurality of (e.g., six in the example illustrated in FIG. 1) differential amplifiers (differential amps) 21-26, a plurality of (e.g., two in the example illustrated in FIG. 1) A/D converters 27, 28, and an arithmetic unit 29.

The differential amplifier 21 includes a first input terminal, a second input terminal, and an output terminal. The first input terminal is a non-inverting input terminal and is electrically connected to the node of connection between the first detecting magnetoresistors 131, 133 of the first detecting bridge circuit 13. The second input terminal is an inverting input terminal and is electrically connected to the node of connection between the first detecting magnetoresistors 132, 134 of the first detecting bridge circuit 13. The differential amplifier 21 makes differential amplification on the +cos signal provided to its first input terminal and the −cos signal provided to its second input terminal, thereby generating a cos signal, of which the amplitude has been doubled. The differential amplifier 21 outputs the cos signal thus generated (hereinafter referred to as an "output signal V1") through its output terminal.

The differential amplifier 22 includes a first input terminal, a second input terminal, and an output terminal. The first input terminal is a non-inverting input terminal and is electrically connected to the node of connection between the second detecting magnetoresistors 141, 143 of the second detecting bridge circuit 14. The second input terminal is an inverting input terminal and is electrically connected to the node of connection between the second detecting magnetoresistors 142, 144 of the second detecting bridge circuit 14. The differential amplifier 22 makes differential amplification on the +sin signal provided to its first input terminal and the −sin signal provided to its second input terminal, thereby generating a sin signal, of which the amplitude has been doubled. The differential amplifier 22 outputs the sin signal thus generated (hereinafter referred to as an "output signal V2") through its output terminal.

The differential amplifier 23 includes a first input terminal, a second input terminal, and an output terminal. The first input terminal is a non-inverting input terminal and is electrically connected to the node of connection between the first canceling magnetoresistors 151, 153 of the first canceling bridge circuit 15. The second input terminal is an inverting input terminal and is electrically connected to the node of connection between the first canceling magnetoresistors 152, 154 of the first canceling bridge circuit 15. The differential amplifier 23 makes differential amplification on the +cos signal provided to its first input terminal and the −cos signal provided to its second input terminal, thereby generating a cos signal, of which the amplitude has been doubled. The differential amplifier 23 outputs the cos signal thus generated (hereinafter referred to as an "output signal V3") through its output terminal.

The differential amplifier 24 includes a first input terminal, a second input terminal, and an output terminal. The first input terminal is a non-inverting input terminal and is electrically connected to the node of connection between the second canceling magnetoresistors 161, 163 of the second canceling bridge circuit 16. The second input terminal is an inverting input terminal and is electrically connected to the node of connection between the second canceling magnetoresistors 162, 164 of the second canceling bridge circuit 16. The differential amplifier 24 makes differential amplification on the +sin signal provided to its first input terminal and the −sin signal provided to its second input terminal, thereby generating a sin signal, of which the amplitude has been doubled. The differential amplifier 24 outputs the sin signal thus generated (hereinafter referred to as an "output signal V4") through its output terminal.

The differential amplifier 25 includes a first input terminal, a second input terminal, and an output terminal. The first input terminal is a non-inverting input terminal and receives the output signal V1 from the differential amplifier 21. The second input terminal is an inverting input terminal and receives the output signal V3 from the differential amplifier 23. The differential amplifier 25 makes differential amplification on the output signal V1 provided to its first input terminal and the output signal V3 provided to its second input terminal, thereby generating an output signal V5 and delivering the output signal V5 through its output terminal.

The differential amplifier 26 includes a first input terminal, a second input terminal, and an output terminal. The first input terminal is a non-inverting input terminal and receives the output signal V2 from the differential amplifier 22. The second input terminal is an inverting input terminal and receives the output signal V4 from the differential amplifier 24. The differential amplifier 26 makes differential amplification on the output signal V2 provided to its first input terminal and the output signal V4 provided to its second input terminal, thereby generating an output signal V6 and delivering the output signal V6 through its output terminal.

The A/D converter 27 converts an analog signal (cos signal) supplied from the differential amplifier 25 into a digital signal at a predetermined sampling rate and outputs the digital signal thus obtained.

The A/D converter 28 converts an analog signal (sin signal) supplied from the differential amplifier 26 into a digital signal at a predetermined sampling rate and outputs the digital signal thus obtained.

The arithmetic unit 29 performs predetermined arithmetic processing on the two digital signals (namely, the cos signal and the sin signal) supplied from the A/D converters 27, 29, respectively. Specifically, the arithmetic unit 29 performs an arctan operation on these two digital signals to obtain an angle. In this case, if the angle of rotation of the rotator 200 is θ, then the angle calculated by the arctan operation is 2θ+30. Therefore, the arithmetic unit 29 may obtain the angle of rotation θ by subtracting 30 from the angle calculated and then multiplying the product by ½, The processing circuit 2 is implemented as, for example, a microcomputer including a processor and a memory. That is to say, the processing circuit 2 is implemented as a computer system including a processor and a memory. The computer system performs the function of the processing circuit 2 by making the processor execute an appropriate program. The program may be stored in advance in the memory. Alternatively, the program may also be downloaded via a telecommunications line such as the Internet or distributed after having been stored in a non-transitory storage medium such as a memory card.

Note that in the following description, the output signals V1, V2 of the differential amplifiers 21, 22 will be hereinafter sometimes referred to as "output signals V1, V2 of the detecting magnetoresistance element 11." Likewise, the output signals V3, V4 of the differential amplifiers 23, 24 will be hereinafter referred to as "output signals V3, V4 of the canceling magnetoresistance element 12."

(3) Differential Operation

Figure 3A:
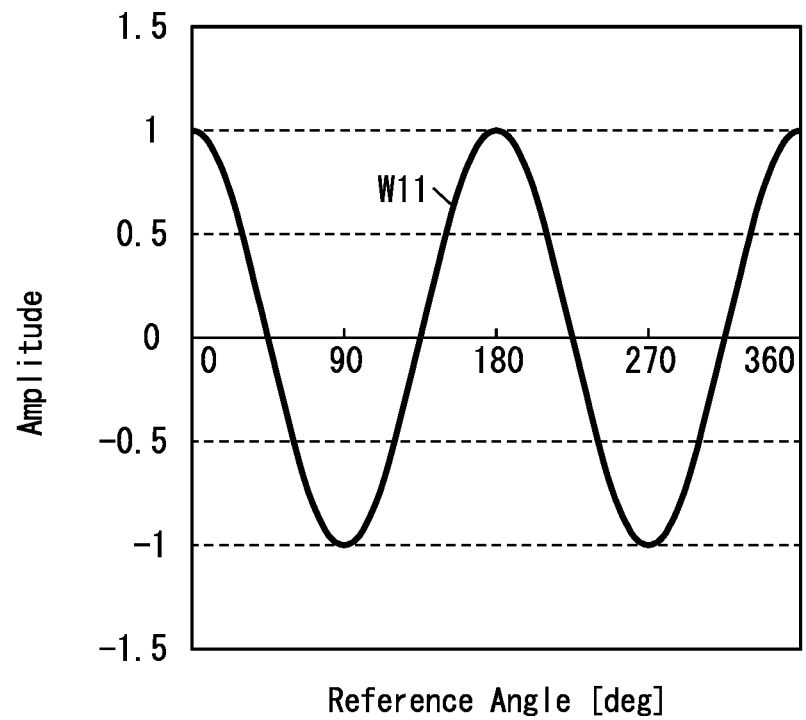
FIGS. 3A and 3B show the waveforms of a pair of output signals of a detecting magnetoresistance element as a constituent element of the magnetic sensor.
Figure 3B:
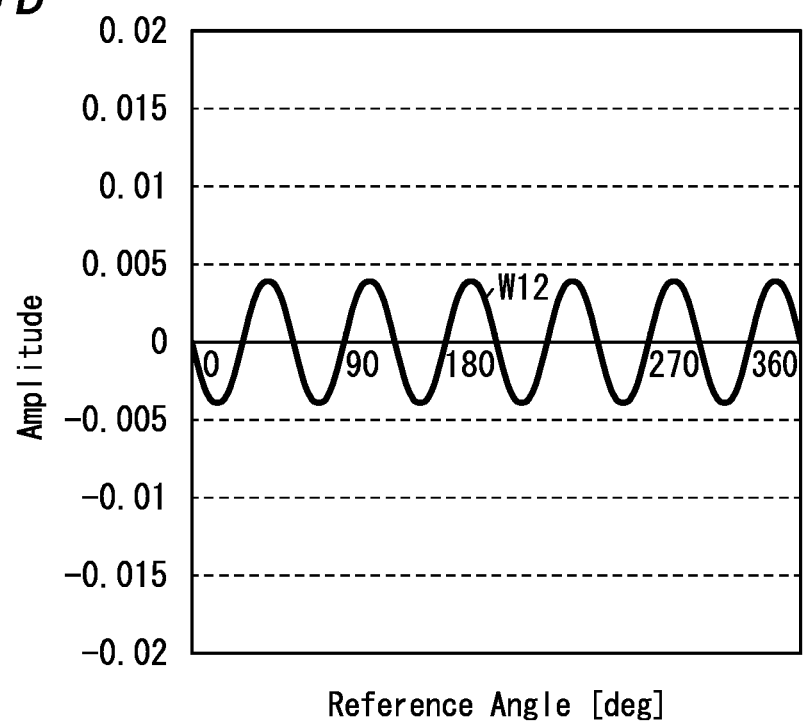
Figure 4A:
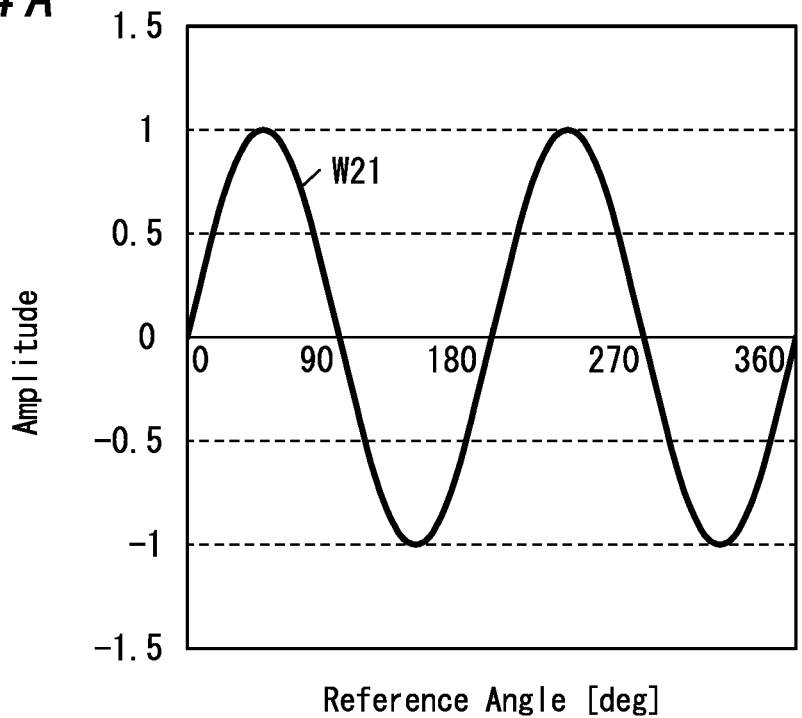
FIGS. 4A and 4B show the waveforms of another pair of output signals of the detecting magnetoresistance element as a constituent element of the magnetic sensor.
Figure 4B:
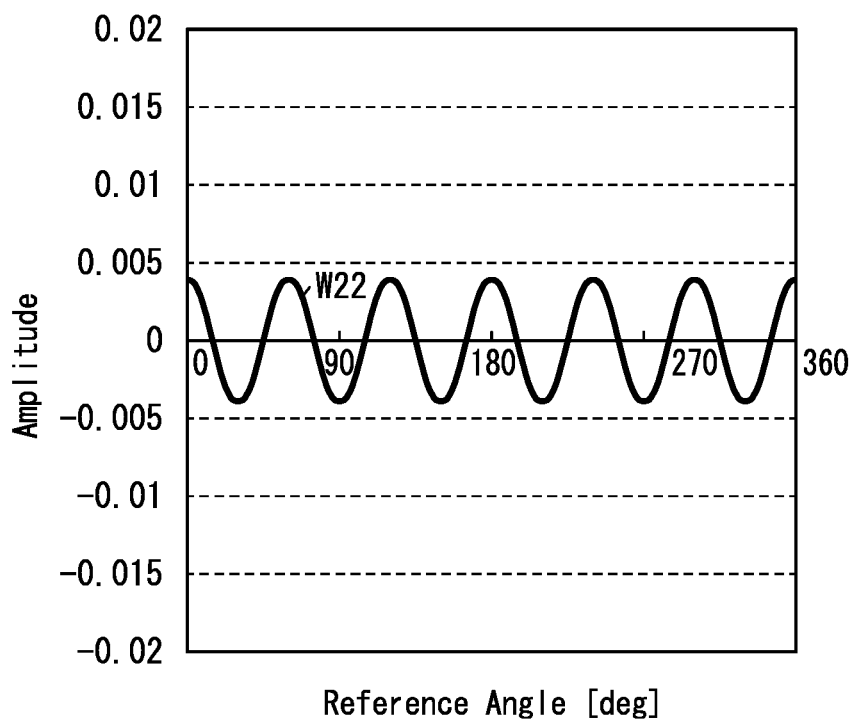
Figure 5A:
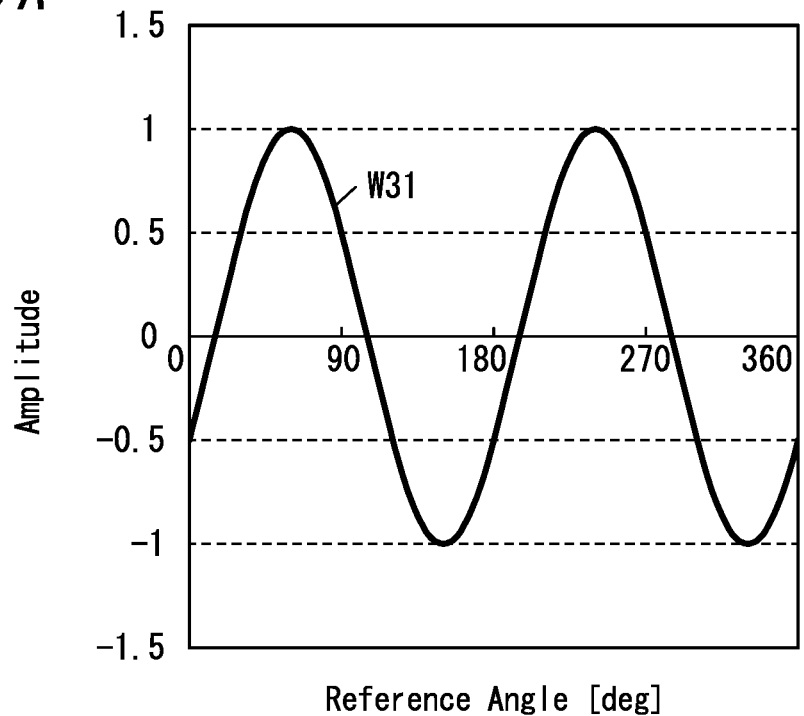
FIGS. 5A and 5B show the waveforms of a pair of output signals of a canceling magnetoresistance element as a constituent element of the magnetic sensor.
Figure 5B:
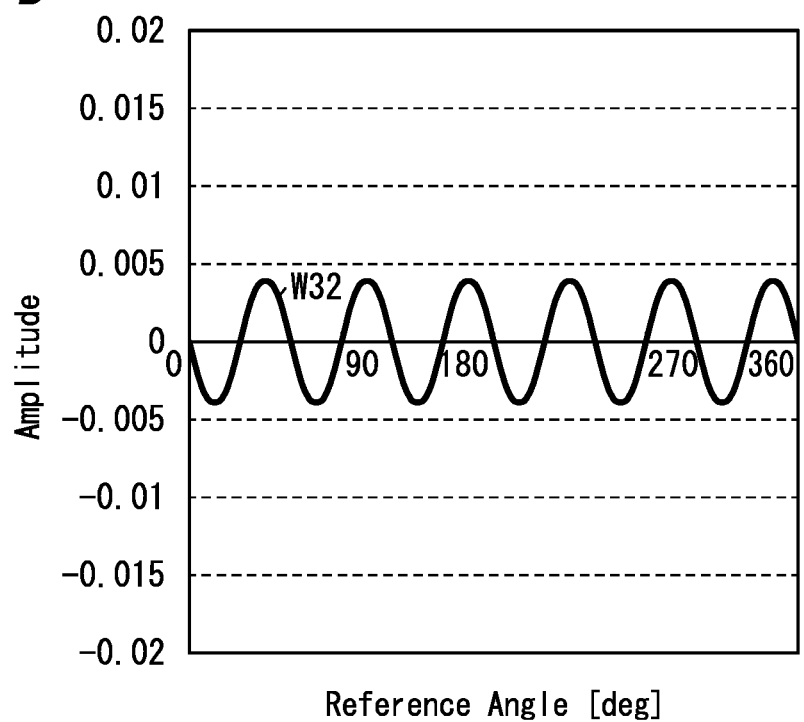
Figure 6A:
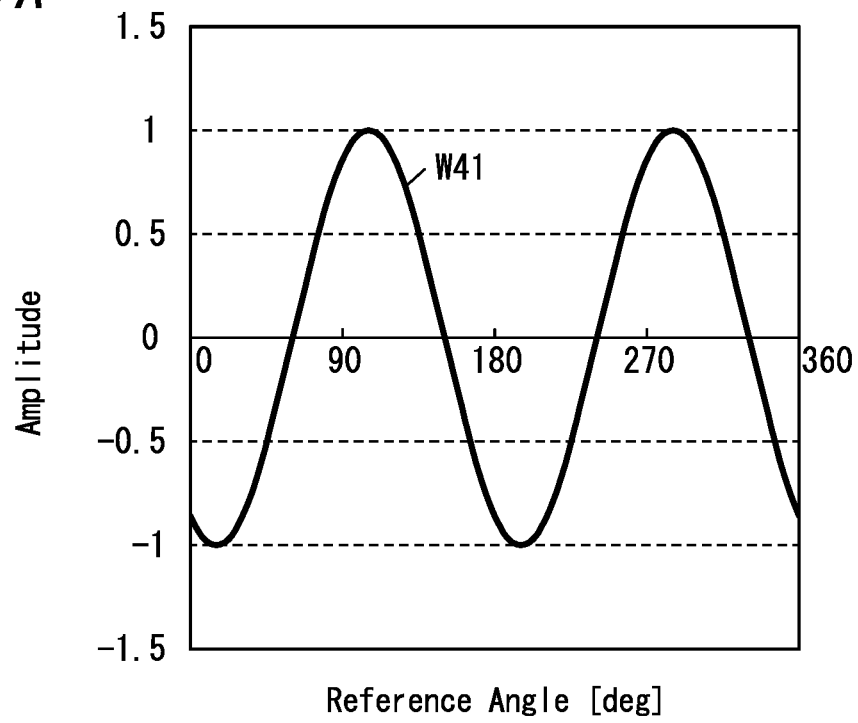
FIGS. 6A and 6B show the waveforms of another pair of output signals of the canceling magnetoresistance element as a constituent element of the magnetic sensor.
Figure 6B:
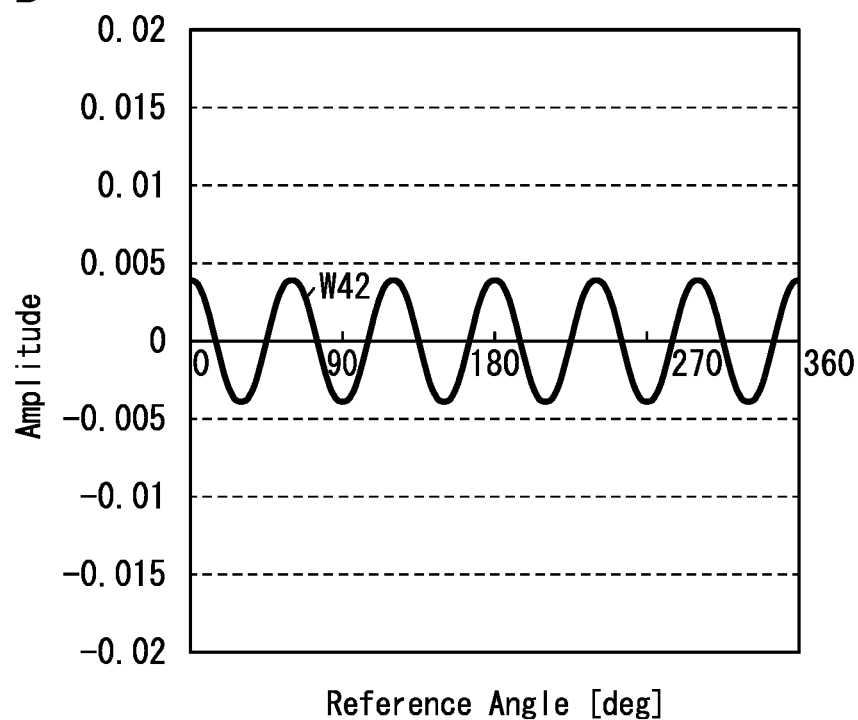
Figure 7A:
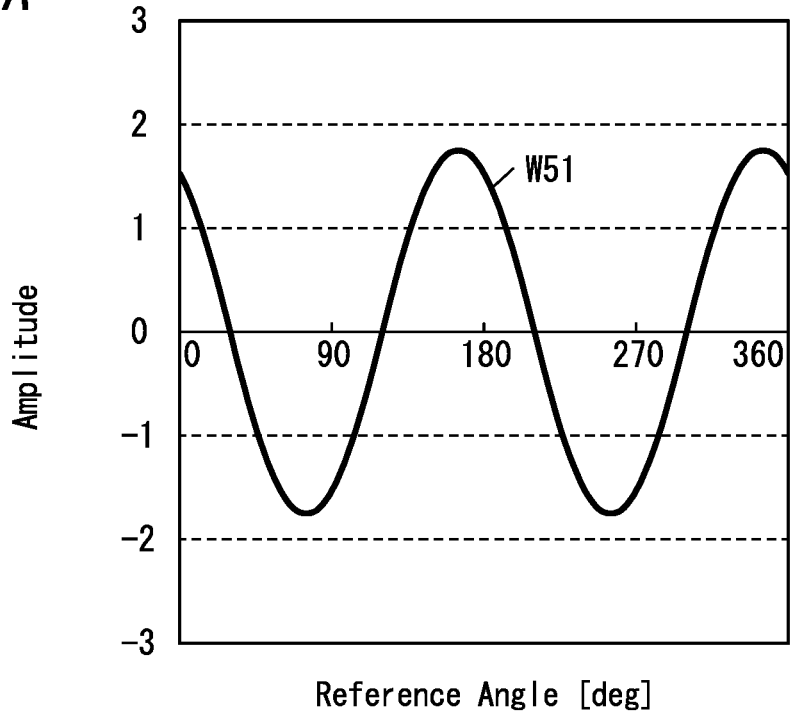
FIGS. 7A and 7B show the waveform of a signal obtained after a differential operation has been performed on a pair of output signals of a detecting magnetoresistance element and a canceling magnetoresistance element as constituent elements of the magnetic sensor.
Figure 7B:
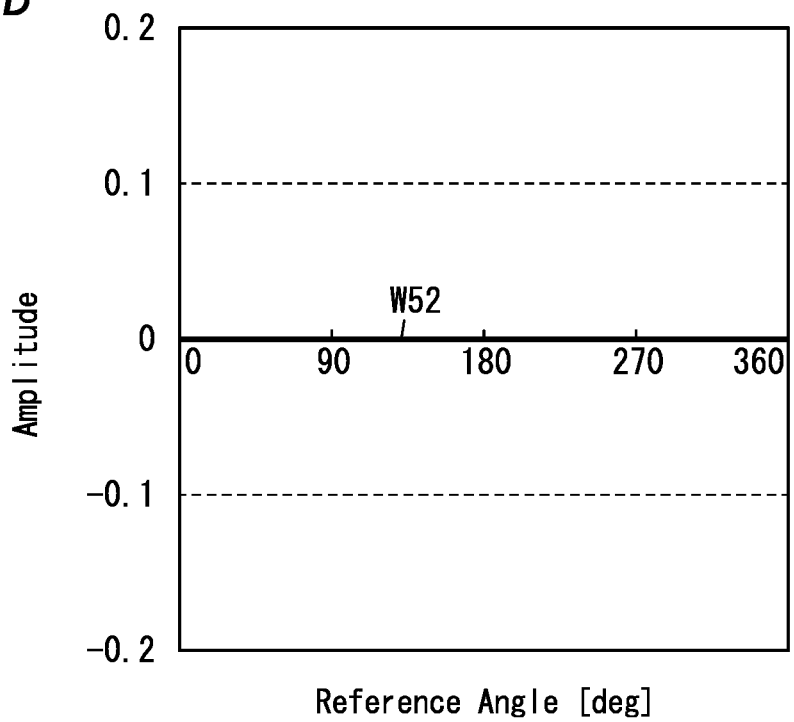
Figure 8A:
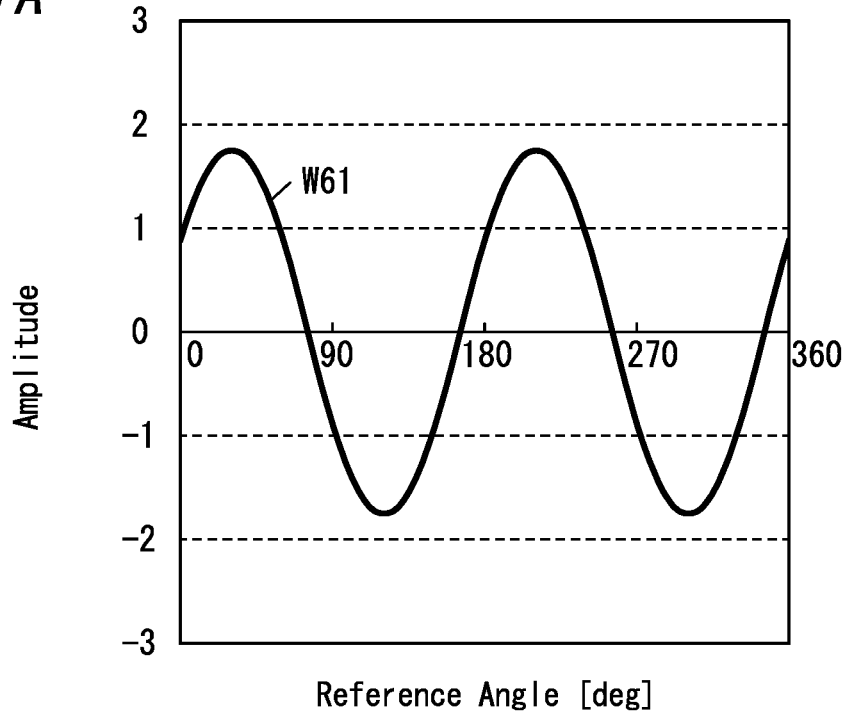
FIGS. 8A and 8B show the waveform of a signal obtained after a differential operation has been performed on another pair of output signals of a detecting magnetoresistance element and a canceling magnetoresistance element as constituent elements of the magnetic sensor.
Figure 8B:
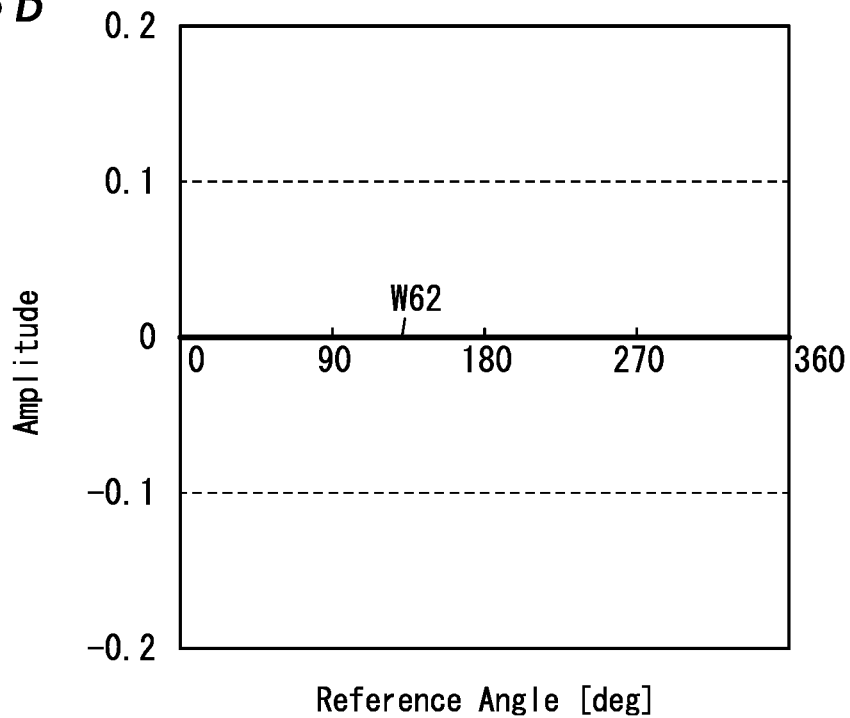

Next, it will be described with reference to FIGS. 3A-8B how the processing circuit 2 performs a differential operation. FIG. 3A shows the waveform of a fundamental harmonic W11 of the output signal V1 of the differential amplifier 21. FIG. 3B shows the waveform of a third harmonic W12. FIG. 4A shows the waveform of a fundamental harmonic W21 of the output signal V2 of the differential amplifier 22. FIG. 4B shows the waveform of a third harmonic W22. FIG. 5A shows the waveform of a fundamental harmonic W31 of the output signal V3 of the differential amplifier 23. FIG. 5B shows the waveform of a third harmonic W32. FIG. 6A shows the waveform of a fundamental harmonic W41 of the output signal V4 of the differential amplifier 24. FIG. 6B shows the waveform of a third harmonic W42. FIG. 7A shows the waveform of a fundamental harmonic W51 after differential amplification has been made on the output signals V1 and V3. FIG. 7B shows the waveform of a third harmonic W52. FIG. 8A shows the waveform of a fundamental harmonic W61 after differential amplification has been made on the output signals V2 and V4. FIG. 8B shows the waveform of a third harmonic W62.

The output signal V1 of the differential amplifier 21 is given by the following Formula (1), where θ is the angle of rotation of the rotator 200 and a is a coefficient:

$$V1 = \cos(2θ) + a \times \{-\sin(6θ)\} \tag{1}$$

This Formula (1) may be rewritten into the following Formula (2):

$$V1 = \cos(2θ) + a \times \cos\{3 \times 2 \times (45-θ)\} \tag{2}$$

In Formula (2), the first term corresponds to the fundamental harmonic W11 (see FIG. 3A) and the second term corresponds to the third harmonic W12 (see FIG. 3B).

Also, the output signal V2 of the differential amplifier 22 is given by the following Formula (3):

$$V2 = \sin(2θ) + a \times \cos(6θ) \tag{3}$$

This Formula (3) may be rewritten into the following Formula (4):

$$V2 = \cos\{2 \times (θ-45)\} + a \times \cos\{3 \times 2 \times (45-θ-45)\} \tag{4}$$

In Formula (4), the first term corresponds to the fundamental harmonic W21 (see FIG. 4A) and the second term corresponds to the third harmonic W22 (see FIG. 4B).

Furthermore, the output signal V3 of the differential amplifier 23 is given by the following Formula (5):

$$V3 = \cos\{2 \times (θ-60)\} + a \times \cos\{3 \times 2 \times (45-θ-60)\} \tag{5}$$

In Formula (5), the first term corresponds to the fundamental harmonic W31 (see FIG. 5A) and the second term corresponds to the third harmonic W32 (see FIG. 5B).

Furthermore, the output signal V4 of the differential amplifier 23 is given by the following Formula (6):

$$V4 = \cos\{2 \times (θ-105)\} + a \times \cos\{3 \times 2 \times (45-θ-105)\} \tag{6}$$

In Formula (6), the first term corresponds to the fundamental harmonic W41 (see FIG. 6A) and the second term corresponds to the third harmonic W42 (see FIG. 6B).

The processing circuit 2 obtains the output signal V5 by having the differential amplifier 25 make differential amplification on the output signals V1 and V3. In addition, the processing circuit 2 also obtains the output signal V6 by having the differential amplifier 26 make differential amplification on the output signals V2 and V4. The output signal V5 is given by the following Formula (7) and the output signal V6 is given by the following Formula (8):

$$V5 = \sqrt{3} \times \cos(2θ+30) \tag{7}$$

$$V6 = \sqrt{3} \times \sin(2θ+30) \tag{8}$$

In this case, the amplitude of the output signals V5 and V6 has been doubled by amplification from the amplitude of the output signals V1, V2, V3, and V4.

As for the output signal V5 of the differential amplifier 25, only the fundamental harmonic W51 remains and the third harmonic W52 has gone zero as shown in FIGS. 7A and 7B. Likewise, as for the output signal V5 of the differential amplifier 26, only the fundamental harmonic W61 remains and the third harmonic W62 has gone zero as shown in FIGS. 8A and 8B. As can be seen, the magnetic sensor 1 and sensor system 10 according to this embodiment may remove (or reduce to say the least) the third harmonic included in the output signals V1, V2.

(4) Variations

Note that the embodiment described above is only an exemplary one of various embodiments of the present disclosure and should not be construed as limiting. Rather, the embodiment may be readily modified in various manners depending on a design choice or any other factor without departing from the scope of the present disclosure. Next, variations of the embodiment will be enumerated one after another.

In the sensor system 10 according to the present disclosure, the processing circuit 2 thereof, for example, includes a computer system. The computer system may include a processor and a memory as principal hardware components. The functions of the sensor system 10 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive, any of which is readable for the computer system. The processor of the computer system may be implemented as a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be integrated together in a single device or distributed in multiple devices without limitation.

Also, in the embodiment described above, the plurality of constituent elements of the sensor system 10 are housed in a single housing. However, this is not an essential configuration for the sensor system 10. Alternatively, those constituent elements of the sensor system 10 may be distributed in multiple different housings. Still alternatively, some functions of the sensor system 10 (e.g., the function of the processing circuit 2) may be implemented as a server system or a cloud computing system as well.

(4.1) First Variation

Figure 9:
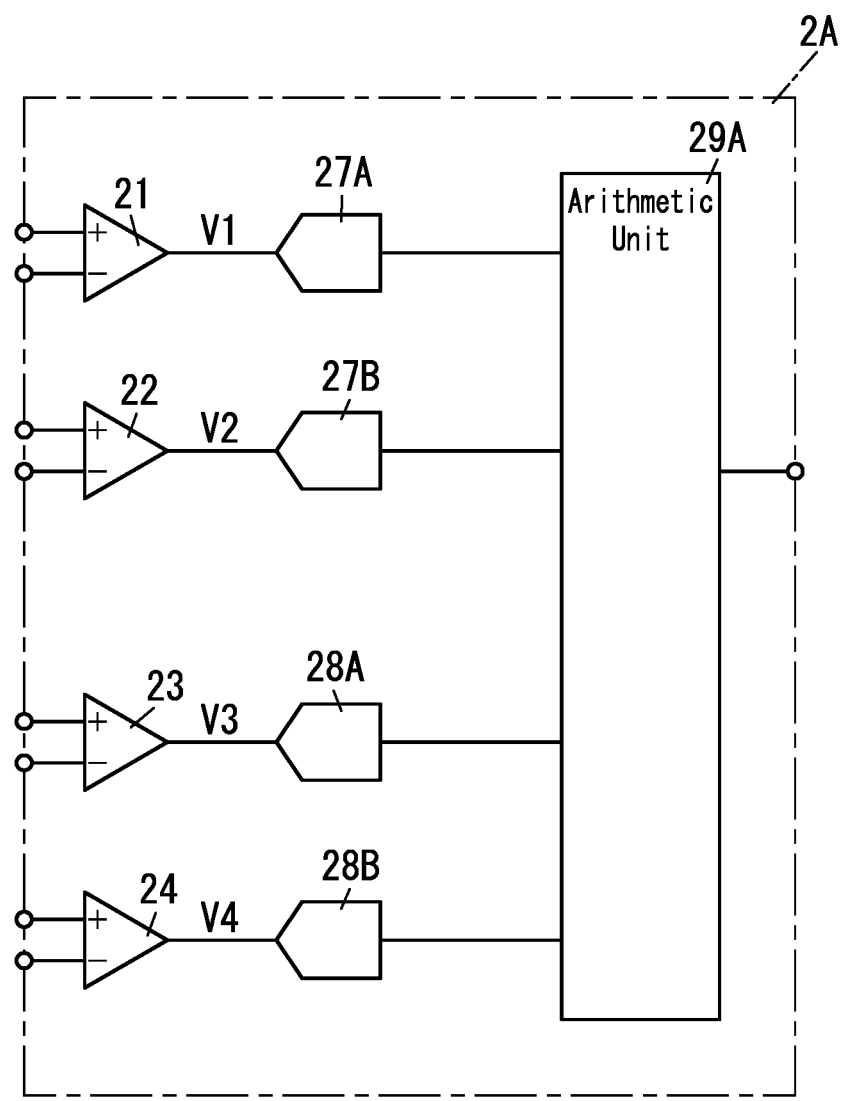
FIG. 9 is a block diagram of a processing circuit as a constituent element of a sensor system according to a first variation of the exemplary embodiment.

In the embodiment described above, the processing circuit 2 performs differential operation on the first output signals V1, V2 of the detecting magnetoresistance element 11 and the second output signals V3, V4 of the canceling magnetoresistance element 12 and then amplifies the results of the differential operation. Alternatively, a processing circuit 2A may amplify the first output signals V1, V2 and the second output signals V3, V4 and then perform differential operation on the first output signals V1, V2 and second output signals V3, V4 that have been amplified as shown in FIG. 9. A sensor system 10 according to a first variation will be described with reference to FIG. 9. The sensor system 10 according to the first variation has the same configuration as the sensor system 10 according to the embodiment described above except the processing circuit 2A. Thus, any constituent element of this first variation, having the same function as a counterpart of the embodiment, will be designated by the same reference numeral as that counterpart's, and description thereof will be omitted herein.

The sensor system 10 according to the first variation includes the magnetic sensor 1 and the processing circuit 2A. The processing circuit 2A includes a plurality of (e.g., four in the example illustrated in FIG. 9) differential amplifiers 21-24, a plurality of (e.g., four in the example illustrated in FIG. 9) A/D converters 27A, 27B, 28A, 28B, and an arithmetic unit 29A.

The differential amplifier 21 makes differential amplification on a +cos signal and a −cos signal supplied from the first detecting bridge circuit 13 to provide an output signal V1. The differential amplifier 22 makes differential amplification on a +sin signal and a −sin signal supplied from the second detecting bridge circuit 14 to provide an output signal V2. The differential amplifier 23 makes differential amplification on a +cos signal and a −cos signal supplied from the first canceling bridge circuit 15 to provide an output signal V3. The differential amplifier 24 makes differential amplification on a +sin signal and a −sin signal supplied from the second canceling bridge circuit 16 to provide an output signal V4.

The A/D converter 27A converts the output signal V1 of the differential amplifier 21 into a digital signal. The A/D converter 27B converts the output signal V2 of the differential amplifier 22 into a digital signal. The A/D converter 28A converts the output signal V3 of the differential amplifier 23 into a digital signal. The A/D converter 28B converts the output signal V4 of the differential amplifier 24 into a digital signal.

The arithmetic unit 29A performs a predetermined type of arithmetic processing on the four digital signals supplied from the A/D converters 27A, 27B, 28A, 28B. Specifically, the arithmetic unit 29A performs arctan operation on the two digital signals supplied from the A/D converters 27A, 27B to obtain a first angle. In addition, the arithmetic unit 29A performs arctan operation on the two digital signals supplied from the A/D converters 28A, 28B to obtain a second angle. In this case, each of the first and second angles obtained by the arctan operation includes no third harmonic components and is converted into fourth harmonic components. Also, in this first variation, the third harmonic with a 60-degree cycle turns into a fourth harmonic with a 45-degree cycle through the arctan operation. Thus, as for the first angle, the arithmetic unit 29A obtains a third angle by multiplying the first angle by ½. As for the second angle, the arithmetic unit 29A subtracts 22.5 from the second angle and then multiplies the remainder by ½ to obtain a fourth angle. Then, the arithmetic unit 29A may obtain the angle of rotation θ by calculating the average of the third and fourth angles. At this time, the harmonic components may be removed (or reduced to say the least) by calculating the sum of the third and fourth angles. That is to say, in the sensor system 10 according to the first variation, the processing circuit 2A amplifies the first output signals V1, V2 of the detecting magnetoresistance element 11 and the second output signals V3, V4 of the canceling magnetoresistance element 12 and then performs differential operation on the first output signals V1, V2 and second output signals V3, V4 that have been amplified. This allows reducing the harmonic components (the third harmonic components, among other things) included in the first output signals V1, V2 of the detecting magnetoresistance element 11.

(4.2) Second Variation

Figure 10:
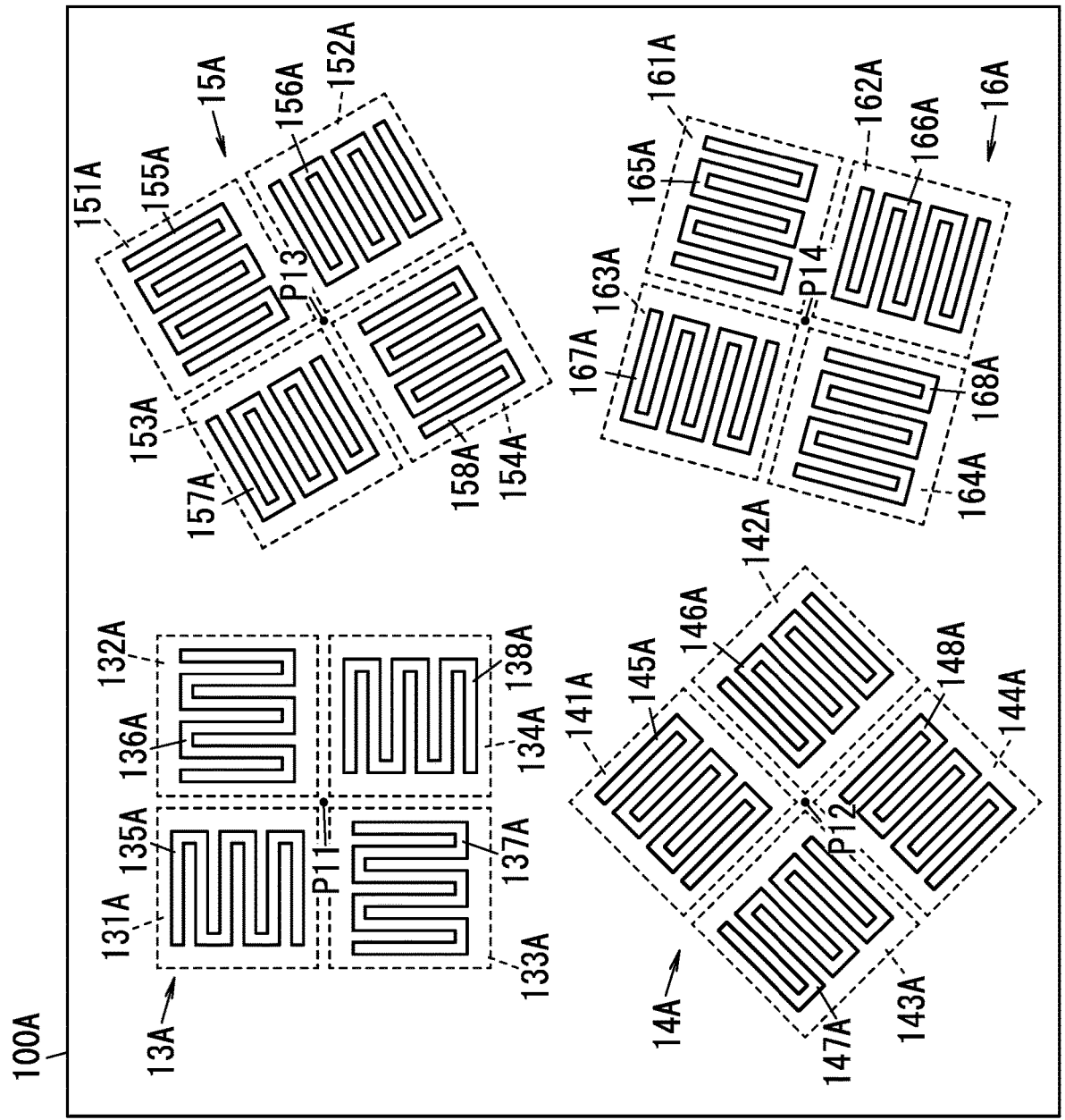
FIG. 10 is a plan view illustrating an exemplary arrangement of magnetoresistance elements that form a magnetic sensor according to a second variation of the exemplary embodiment.

In the embodiment described above, the first detecting bridge circuit 13, the second detecting bridge circuit 14, the first canceling bridge circuit 15, and the second canceling bridge circuit 16 are arranged along the circumference C1 of the same circle as shown in FIG. 2. Alternatively, the center P11 of a first detecting bridge circuit 13A, the center P12 of a second detecting bridge circuit 14A, the center P13 of a first canceling bridge circuit 15A, and the center P14 of a second canceling bridge circuit 16A may be shifted from each other as shown in FIG. 10. A sensor system 10 according to a second variation will be described with reference to FIG. 10. The sensor system 10 according to the second variation has the same configuration as the sensor system 10 according to the embodiment except the arrangement of the first detecting bridge circuit 13A, the second detecting bridge circuit 14A, the first canceling bridge circuit 15A, and the second canceling bridge circuit 16A. Thus, any constituent element of this second variation, having the same function as a counterpart of the sensor system 10 according to the embodiment, will be designated by the same reference numeral as that counterpart's, and description thereof will be omitted herein.

The sensor system 10 according to the second variation includes the magnetic sensor 1 and the processing circuit 2. The magnetic sensor 1 includes the detecting magnetoresistance element 11 and the canceling magnetoresistance element 12. The detecting magnetoresistance element 11 includes the first detecting bridge circuit 13A and the second detecting bridge circuit 14A. The canceling magnetoresistance element 12 includes the first canceling bridge circuit 15A and the second canceling bridge circuit 16A.

The first detecting bridge circuit 13A has four first detecting magnetoresistance patterns 135A-138A as shown in FIG. 10. The second detecting bridge circuit 14A has four second detecting magnetoresistance patterns 145A-148A as shown in FIG. 10. The four first detecting magnetoresistance patterns 135A-138A are mounted on one surface of a board 100A and have a square shape in a plan view. The four second detecting magnetoresistance patterns 145A-148A are mounted on the one surface of the board 100A and have a square shape in a plan view.

The first canceling bridge circuit 15A has four first canceling magnetoresistance patterns 155A-158A as shown in FIG. 10. The second canceling bridge circuit 16A has four second canceling magnetoresistance patterns 165A-168A as shown in FIG. 10. The four first canceling magnetoresistance patterns 155A-158A are mounted on the one surface of the board 100A and have a square shape in a plan view. The four second canceling magnetoresistance patterns 165A-168A are mounted on the one surface of the board 100A and have a square shape in a plan view.

The first detecting bridge circuit 13A, the second detecting bridge circuit 14A, the first canceling bridge circuit 15A, and the second canceling bridge circuit 16A are arranged such that their respective centers P11, P12, P13, P14 are shifted from each other. As used herein, the "center of a bridge circuit" refers to the center of magnetoresistance patterns, forming the bridge circuit, in a plan view when the magnetoresistance patterns are mounted on the board. For example, in the first detecting bridge circuit 13A, the center P11 shown in FIG. 10 is the "center of the bridge circuit."

In the sensor system 10 according to the second variation, the center P11 of the first detecting bridge circuit 13A, the center P12 of the second detecting bridge circuit 14A, the center P13 of the first canceling bridge circuit 15A, and the center P14 of the second canceling bridge circuit 16A are shifted from each other. This allows arranging the bridge circuits 13A-16A on the single board 100A such that the magnetoresistance patterns 135A-168A of each of these bridge circuits 13A-16A are collectively arranged in their designated area.

(4.3) Other Variations

Next, other variations of the embodiment described above will be enumerated one after another.

In the embodiment described above, the detecting magnetoresistance element 11 and the canceling magnetoresistance element 12 are both implemented as anisotropic magnetoresistance (AMR) elements. However, this is only an example and should not be construed as limiting. Alternatively, one of the detecting magnetoresistance element 11 or the canceling magnetoresistance element 12 may be implemented as an anisotropic magnetoresistance element and the other may be implemented as a tunnel magnetoresistance (TMR) element or a giant magnetoresistance (GMR) element. Still alternatively, both the detecting magnetoresistance element 11 and the canceling magnetoresistance element 12 may be implemented as either tunnel magnetoresistance elements or giant magnetoresistance elements. Note that if the detecting magnetoresistance element 11 is implemented as a TMR element or a GMR element, then $2\theta$ in Formulae (1), (2), (3), (7), and (8) needs to be replaced with $\theta$, $6\theta$ in Formulae (1) and (3) needs to be replaced with $3\theta$, and "2" in Formulae (2) and (4) needs to be deleted. On the other hand, if the canceling magnetoresistance element 12 is implemented as a TMR element or a GMR element, then "2" in Formulae (5) and (6) needs to be deleted. In addition, there is need for the arithmetic unit 29 to perform the arithmetic processing of multiplying by ½.

In the embodiment described above, the first detecting magnetoresistance patterns 135-138, the second detecting magnetoresistance patterns 145-148, the first canceling magnetoresistance patterns 155-158, and the second canceling magnetoresistance patterns 165-168 are all full-bridge connected. Alternatively, the first detecting magnetoresistance patterns and the second detecting magnetoresistance patterns may be full-bridge connected and the first canceling magnetoresistance patterns and the second canceling magnetoresistance patterns may be half-bridge connected, for example, or vice versa. If the first detecting magnetoresistance patterns and the second detecting magnetoresistance patterns are half-bridge connected, then the differential amplifiers 21 and 22 may be omitted. On the other hand, if the first canceling magnetoresistance patterns and the second canceling magnetoresistance patterns are half-bridge connected, then the differential amplifiers 23, 24 may be omitted.

In the embodiment described above, the first detecting magnetoresistance patterns 135-138, the second detecting magnetoresistance patterns 145-148, the first canceling magnetoresistance patterns 155-158, and the second canceling magnetoresistance patterns 165-168 are mounted on the single board 100. Alternatively, the first detecting magnetoresistance patterns 135-138, the second detecting magnetoresistance patterns 145-148, the first canceling magnetoresistance patterns 155-158, and the second canceling magnetoresistance patterns 165-168 may be mounted on multiple different boards. For example, the first detecting magnetoresistance patterns 135-138 and the second detecting magnetoresistance patterns 145-148 may be mounted on a first board, while the first canceling magnetoresistance patterns 155-158 and the second canceling magnetoresistance patterns 165-168 may be mounted on a second board. In that case, the first board and the second board may be either laid one on top of the other or arranged laterally side by side. Still alternatively, the first detecting magnetoresistance patterns 135-138 and the second detecting magnetoresistance patterns 145-148 may be mounted on one surface of a board, while the first canceling magnetoresistance patterns 155-158 and the second canceling magnetoresistance patterns 165-168 may be mounted on the other surface of the board.

In the embodiment described above, the tilt angle $\beta1$ formed by the magnetic sensing direction of the canceling magnetoresistance element 12 with respect to the magnetic sensing direction of the detecting magnetoresistance element 11 is 60 degrees. However, the tilt angle $\beta1$ does not have to be 60 degrees but may also be a multiple of 60 degrees. In other words, the tilt angle $\beta1$ needs to satisfy $n \times \alpha/3$, where $\alpha$ is the angle of rotation of the rotator 200 corresponding to one cycle of a fundamental harmonic included in the output signals V1, V2 of the detecting magnetoresistance element 11 and n is a natural number equal to or greater than 1. For example, if the detecting magnetoresistance element 11 is implemented as an AMR element, then a is 180 degrees. In that case, the tilt angle $\beta1$ may be a multiple of 60 degrees.

Alternatively, the tilt angle $\beta1$ formed by the magnetic sensing direction of the canceling magnetoresistance element 12 with respect to the magnetic sensing direction of the detecting magnetoresistance element 11 may also be 30 degrees. In that case, the harmonic components included in the output signals V1, V2 and the harmonic components included in the output signals V3, V4 have opposite phases. Thus, the processing circuit 2 needs to add the output signals V1 and V3 together and add the output signals V2 and V4 together. Furthermore, the tilt angle $\beta1$ does not have to be 30 degrees but has only to satisfy n×α/3+α/2, where n is a natural number equal to or greater than 1.

(Recapitulation)

As can be seen from the foregoing description, a magnetic sensor (1) according to a first aspect is used to detect an angle of rotation of a rotator (200). The magnetic sensor (1) includes a detecting magnetoresistance element (11) and a canceling magnetoresistance element (12). A tilt angle (β1) formed by a magnetic sensing direction (M2) of the canceling magnetoresistance element (12) with respect to a magnetic sensing direction (M1) of the detecting magnetoresistance element (11) falls within a predetermined range. The predetermined range is defined by reference to either n×α/3 or n×α/3+α/2, where α is the angle of rotation corresponding to one cycle of a fundamental harmonic (W11, W21) included in output signals (V1, V2) of the detecting magnetoresistance element (11) and n is a natural number equal to or greater than 1.

This aspect may reduce harmonic components included in the output signals (V1, V2) of the detecting magnetoresistance element (11).

In a magnetic sensor (1) according to a second aspect, which may be implemented in conjunction with the first aspect, each of the detecting magnetoresistance element (11) and the canceling magnetoresistance element (12) is an anisotropic magnetoresistance element.

This aspect may reduce harmonic components included in the output signals (V1, V2) of the detecting magnetoresistance element (11).

In a magnetic sensor (1) according to a third aspect, which may be implemented in conjunction with the first or second aspect, the detecting magnetoresistance element (11) has four detecting magnetoresistance patterns (135-138, 145-148). The four detecting magnetoresistance patterns (135-138, 145-148) are full-bridge connected.

This aspect may improve the detection accuracy of the detecting magnetoresistance element (11).

In a magnetic sensor (1) according to a fourth aspect, which may be implemented in conjunction with any one of the first to third aspects, the canceling magnetoresistance element (12) has four canceling magnetoresistance patterns (155-158, 165-168). The four canceling magnetoresistance patterns (155-158, 165-168) are full-bridge connected.

This aspect may improve the detection accuracy of the detecting magnetoresistance element (11).

In a magnetic sensor (1) according to a fifth aspect, which may be implemented in conjunction with any one of the first to fourth aspects, the detecting magnetoresistance element (11) includes: a first detecting bridge circuit (13A) to output a cosine wave signal; and a second detecting bridge circuit (14A) to output a sine wave signal. The first detecting bridge circuit (13A) and the second detecting bridge circuit (14A) are arranged to have their respective centers (P11, P12) shifted from each other.

This aspect allows the first detecting bridge circuit (13A) and the second detecting bridge circuit (14A) to be arranged on the same plane such that each of the first detecting bridge circuit (13A) and the second detecting bridge circuit (14A) has its magnetoresistance patterns collectively arranged in its designated area.

In a magnetic sensor (1) according to a sixth aspect, which may be implemented in conjunction with the fifth aspect, the canceling magnetoresistance element (12) includes: a first canceling bridge circuit (15A) to output a cosine wave signal; and a second canceling bridge circuit (16A) to output a sine wave signal. The first detecting bridge circuit (13A), the second detecting bridge circuit (14A), the first canceling bridge circuit (15A), and the second canceling bridge circuit (16A) are arranged to have their respective centers (P11, P12, P13, P14) shifted from each other.

This aspect allows the first detecting bridge circuit (13A), the second detecting bridge circuit (14A), the first canceling bridge circuit (15A), and the second canceling bridge circuit (16A) to be arranged on the same plane such that each of the first detecting bridge circuit (13A), the second detecting bridge circuit (14A), the first canceling bridge circuit (15A), and the second canceling bridge circuit (16A) has its magnetoresistance patterns collectively arranged in its designated area.

In a magnetic sensor (1) according to a seventh aspect, which may be implemented in conjunction with any one of the first to fourth aspects, the detecting magnetoresistance element (11) includes: a first detecting bridge circuit (13) to output a cosine wave signal; and a second detecting bridge circuit (14) to output a sine wave signal. The canceling magnetoresistance element (12) includes: a first canceling bridge circuit (15) to output a cosine wave signal; and a second canceling bridge circuit (16) to output a sine wave signal. The first detecting bridge circuit (13), the second detecting bridge circuit (14), the first canceling bridge circuit (15), and the second canceling bridge circuit (16) are arranged along a circumference (C1) of a circle.

This aspect may more effectively reduce the harmonic components included in the output signals (V1, V2) of the detecting magnetoresistance element (11).

In a magnetic sensor (1) according to an eighth aspect, which may be implemented in conjunction with any one of the first to seventh aspects, the detecting magnetoresistance element (11) and the canceling magnetoresistance element (12) are mounted on the same board (100, 100A).

This aspect allows the detecting magnetoresistance element (11) and the canceling magnetoresistance element (12) to be arranged more accurately than in a situation where the detecting magnetoresistance element (11) and the canceling magnetoresistance element (12) are mounted on two different boards.

A sensor system (10) according to a ninth aspect includes: the magnetic sensor (1) according to any one of the first to eighth aspects; and a processing circuit (2, 2A). The processing circuit (2, 2A) performs signal processing on output signals (V1, V2, V3, V4) of the magnetic sensor (1).

This aspect may reduce harmonic components included in the output signals (V1, V2) of the detecting magnetoresistance element (11).

In a sensor system (10) according to a tenth aspect, which may be implemented in conjunction with the ninth aspect, the processing circuit (2) performs a differential operation on first output signals (V1, V2) of the detecting magnetoresistance element (11) and second output signals (V3, V4) of the canceling magnetoresistance element (12) and then amplifies a result of the differential operation.

This aspect may reduce harmonic components included in the first output signals (V1, V2) of the detecting magnetoresistance element (11).

In a sensor system (10) according to an eleventh aspect, which may be implemented in conjunction with the ninth aspect, the processing circuit (2A) amplifies first output signals (V1, V2) of the detecting magnetoresistance element (11) and second output signals (V3, V4) of the canceling magnetoresistance element (12) and then performs a differential operation on the first output signals (V1, V2) and the second output signals (V3, V4) that have been amplified.

This aspect may reduce harmonic components included in the first output signals (V1, V2) of the detecting magnetoresistance element (11).

Note that the constituent elements according to the second to eighth aspects are not essential constituent elements for the magnetic sensor (1) but may be omitted as appropriate.

Note that the constituent elements according to the tenth or eleventh aspect are not essential constituent elements for the sensor system (10) but may be omitted as appropriate.

REFERENCE SIGNS LIST

1 Magnetic Sensor
11 Detecting Magnetoresistance Element
12 Canceling Magnetoresistance Element
13, 13A First Detecting Bridge Circuit
135-138 Detecting Magnetoresistance Pattern
14, 14A Second Detecting Bridge Circuit
145-148 Detecting Magnetoresistance Pattern
15, 15A First Canceling Bridge Circuit
155-158 Canceling Magnetoresistance Pattern
16, 16A Second Canceling Bridge Circuit
165-168 Canceling Magnetoresistance Pattern
100, 100A Board
2, 2A Processing Circuit
C1 Circumference of Circle
M1 Magnetic Sensing Direction of Detecting Magnetoresistance Element
M2 Magnetic Sensing Direction of Canceling Magnetoresistance Element
P11, P12, P13, P14 Center
V1, V2 Output Signal (First Output Signal)
V3, V4 Output Signal (Second Output Signal)
W11, W21 Fundamental Harmonic
β1 Tilt Angle

The invention claimed is:

1. A magnetic sensor for use to detect an angle of rotation of a rotator, the magnetic sensor comprising:
a detecting magnetoresistance element; and
a canceling magnetoresistance element,
a tilt angle formed by a magnetic sensing direction of the canceling magnetoresistance element with respect to a magnetic sensing direction of the detecting magnetoresistance element falling within a predetermined range defined by reference to either $n\times\alpha/3$ or $n\times\alpha/3+\alpha/2$, where $\alpha$ is the angle of rotation corresponding to one cycle of a fundamental harmonic included in output signals of the detecting magnetoresistance element and n is a natural number equal to or greater than 1,
the detecting magnetoresistance element including:
a first detecting bridge circuit configured to output a cosine wave signal; and
a second detecting bridge circuit configured to output a sine wave signal,
the canceling magnetoresistance element including:
a first canceling bridge circuit configured to output a cosine wave signal; and
a second canceling bridge circuit configured to output a sine wave signal, and
the first detecting bridge circuit, the second detecting bridge circuit, the first canceling bridge circuit, and the second canceling bridge circuit are arranged to have their respective centers in common with each other.

2. The magnetic sensor of claim 1, wherein each of the detecting magnetoresistance element and the canceling magnetoresistance element is an anisotropic magnetoresistance element.

3. The magnetic sensor of claim 2, wherein
the detecting magnetoresistance element has four detecting magnetoresistance patterns, and
the four detecting magnetoresistance patterns are full-bridge connected.

4. The magnetic sensor of claim 2, wherein
the canceling magnetoresistance element has four canceling magnetoresistance patterns, and
the four canceling magnetoresistance patterns are full-bridge connected.

5. The magnetic sensor of claim 1, wherein
the detecting magnetoresistance element has four detecting magnetoresistance patterns, and
the four detecting magnetoresistance patterns are full-bridge connected.

6. The magnetic sensor of claim 5, wherein
the canceling magnetoresistance element has four canceling magnetoresistance patterns, and
the four canceling magnetoresistance patterns are full-bridge connected.

7. The magnetic sensor of claim 1, wherein
the canceling magnetoresistance element has four canceling magnetoresistance patterns, and
the four canceling magnetoresistance patterns are full-bridge connected.

8. The magnetic sensor of claim 1, wherein
the first detecting bridge circuit, the second detecting bridge circuit, the first canceling bridge circuit, and the second canceling bridge circuit are arranged along a circumference of a circle.

9. The magnetic sensor of claim 1, wherein the detecting magnetoresistance element and the canceling magnetoresistance element are mounted on the same board.

10. A sensor system comprising:
the magnetic sensor of claim 1; and
a processing circuit configured to perform signal processing on output signals of the magnetic sensor.

11. The sensor system of claim 10, wherein the processing circuit is configured to perform a differential operation on first output signals of the detecting magnetoresistance element and second output signals of the canceling magnetoresistance element and then amplify a result of the differential operation.

12. The sensor system of claim 10, wherein the processing circuit is configured to amplify first output signals of the detecting magnetoresistance element and second output signals of the canceling magnetoresistance element and then perform a differential operation on the first output signals and the second output signals that have been amplified.

* * * * *